United States Patent
Pelley et al.

(12) 
(10) Patent No.: US 6,323,704 B1
(45) Date of Patent: Nov. 27, 2001

(54) MULTIPLE VOLTAGE COMPATIBLE I/O BUFFER

(75) Inventors: Perry H. Pelley; Kevin Tran, both of Austin, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/633,948

(22) Filed: Aug. 8, 2000

(51) Int. Cl.⁷ .................................... H03K 3/00
(52) U.S. Cl. .................... 327/112; 327/77; 327/333; 327/81
(58) Field of Search .................. 326/80, 81, 86; 327/77, 88, 108, 109, 111, 112, 427, 333

(56) References Cited

U.S. PATENT DOCUMENTS 5,438,280 * 8/1995 Sugawara ................. 326/71
5,512,844 * 4/1996 Nakakura et al. ............. 326/81
6,150,843 * 11/2000 Shiffer et al. ................. 326/80

* cited by examiner

*Primary Examiner*—Jeffrey Zweizig
(74) *Attorney, Agent, or Firm*—Joanna G. Chiu

(57) ABSTRACT

Input and output buffer circuitry (12, 14, 16) is provided which are compatible with busses operating at different voltage levels. The buffer circuitry is self-configuring based on the type of bus to which it is coupled. The buffer circuitry includes voltage level detect circuitry (20) and pad level detect circuitry (28) which can reconfigure driver (34, 54) and level shifter circuits (24, 26) in order to protect the switching devices of the buffers.

21 Claims, 4 Drawing Sheets

MULTIPLE VOLTAGE COMPATIBLE I/O BUFFER

FIELD OF THE INVENTION

The present invention relates to I/O buffer circuitry, and in particular, the resent invention relates to I/O buffer circuitry which is compatible with multiple voltage levels.

RELATED ART

A typical integrated circuit (IC) includes input/output (I/O) buffer circuitry for interfacing with external connections such as bus connections. Since various bus standards exist, each I/O buffer must be designed to be compatible with the bus standard with which the IC will be used. For example, there are multiple standards for Peripheral Component Interconnect (PCI) buses. In one PCI standard, the PCI bus operates at a voltage of 3.3 volts. In another PCI standard, the PCI bus operates at a voltage of 5 volts. As a result, if a connection pad of an IC is intended to be used with a 3.3 volt PCI bus, the buffer circuitry associated with that pad must be designed to handle a 3.3 volt bus. Similarly, if a connection pad of the IC is intended to be used with a 5 volt PCI bus, the buffer circuitry associated with that pad must be designed to handle a 5 volt bus without transistor break down. This circuitry is a solution for preventing a break down voltage applied on transistors of the buffer and to guarantee the voltage difference across the transistors to be no larger than a predetermined safe voltage (e.g. 4.1 volts). Therefore, prior art buffer circuitry is designed to work with a single desired standard. This requires a designer to design buffer circuitry based on the type of bus with which the buffer will be used.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, the term "bus" is used to refer to a plurality of signals or conductors which may be used to transfer one or more various types of information, such as data, addresses, control, or status. The terms "assert" and "negate" are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Similarly, if the logically true state is a "high signal" or "logic level high", then the logically false state is a "low signal" or a "logic level low". And if the logically true state is a "low signal" or a "logic level low", the logically false state is a "high signal" or "logic level high".

Generally, embodiments of the present invention provide input and output buffer circuits for use with the I/O pins of an integrated circuit. In particular, the invention provides buffer circuits which are compatible with buses operating at different voltage levels. For example, as mentioned above, there are multiple standards for PCI buses. In one standard, the PCI bus operates at 3.3 volts. In another standard, the PCI bus operates at 5 volts. The buffers described herein are self-configurable and therefore are capable of operating with various voltage levels. The buffers include circuitry which can reconfigure driver and level shifter circuits in order to protect the switching devices of the buffers. The example described below is capable of operating over a voltage range of approximately 1.8 to 5 volts. Of course, embodiments of the invention are not limited to these voltage levels, or to use with PCI buses or to the PCI bus standards described.

Figure 1:
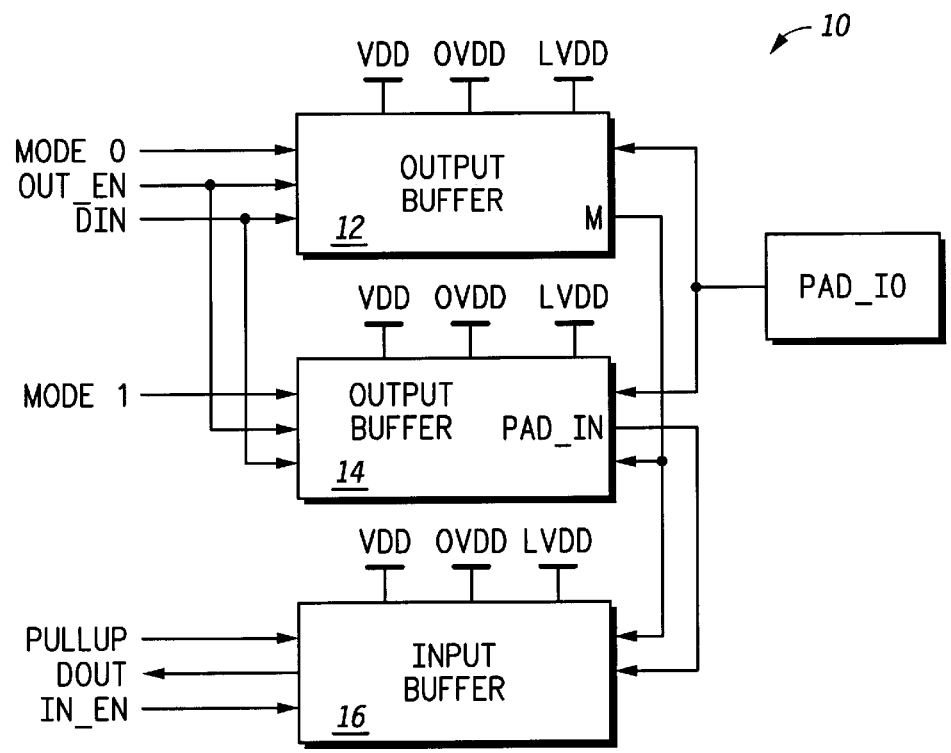
FIG. 1 is a top level block diagram of buffer circuitry for an integrated circuit, according to one embodiment of the present invention.

FIG. 1 is a block diagram of buffer circuitry 10 for use with an integrated circuit (IC). FIG. 1 also shows an input/output pad (PAD_IO) of the IC which provides a data interface between the IC and a bus. The buffer circuitry 10 includes a first output buffer 12 and a second output buffer 14. Depending on the load, one or both of the output buffers 12 or 14 can be enabled to drive the output signals to a desired level. For example, if a 40 ohm load is coupled to the bus, one of the two output buffers 12 or 14 can be enabled. If a 20 ohm load is coupled to the bus, both of the output buffers 12 and 14 can be enabled to adequately drive the load. FIG. 1 also shows an input buffer 16. The input buffer 16 is also coupled to the PAD_IO via the $PAD_{13}$ IN connection on the output buffer 14.

The buffers 12, 14, and 16 include connections to various external voltage sources including VDD, OVDD, and LVDD. VDD is a general voltage source used by the IC. In the embodiment described, VDD is 1.8 volts. OVDD is the output buffer supply voltage, and in the embodiment described, is 3.3 volts. LVDD is the output buffer tolerance supply voltage and may be either 3.3 volts or 5 volts in the embodiment described. VDD is the internal supply voltage for the circuit. OVDD is the external supply voltage for the I/O buffer drivers, i.e., the maximum voltage that can be driven by the buffer. LVDD is the maximum external supply voltage of any buffer on the I/O bus and the voltage to which diode clamping occurs. The buffer is LVDD tolerant.

The output buffers 12 and 14 include connections MODE 0 and MODE 1, respectively, which control which output buffers are used while sending data to the bus. The output buffers 12 and 14 also include a connection to an output enable signal $OUT_{13}$ EN for enabling or disabling the output buffers 12 and 14. The output buffers 12 and 14 also include a connection to a data in signal DIN from the core of the IC. Similarly, the input buffer 16 includes a connection to an input enable signal $IN_{13}$ EN for enabling or disabling the input buffer 16. The input buffer 16 also includes a connection to a data out signal DOUT for sending received data to the core of the IC. The output buffers 12 and 14 include a tolerance voltage detect connection for sending a tolerance voltage detect signal M to the input buffer 16 identifying the 5 volt tolerant signal arriving to the pad PAD_IO (described below). The input buffer 16 also includes an internal PULLUP connection for pulling the pad PAD_IO to OVDD when all of the buffers 12, 14, and 16 are disabled.

In general, embodiments of the present invention provide a circuit for preventing breakdown voltages from being applied on transistors in an I/O buffer circuit for an I/O pin of an IC. Embodiments of the invention include a configuration circuit coupled to the I/O buffer circuit which detects a high voltage signal driven into the I/O pin. The configuration circuit detects the voltage level of an external voltage supply and configures the I/O buffer circuit based on the supply level. For example, during "common voltage range" operation of the circuit (when the I/O pin receives a 3.3 volt signal from an external device), the configuration circuit will be "off", and the buffer circuit will operate normally. During operation when a 5 volt tolerant signal is received by the I/O pin from an external device ("extended voltage range"), the configuration circuit will be "on" and will protect the buffer circuitry from break down voltages applied to the transistors.

Figure 2:
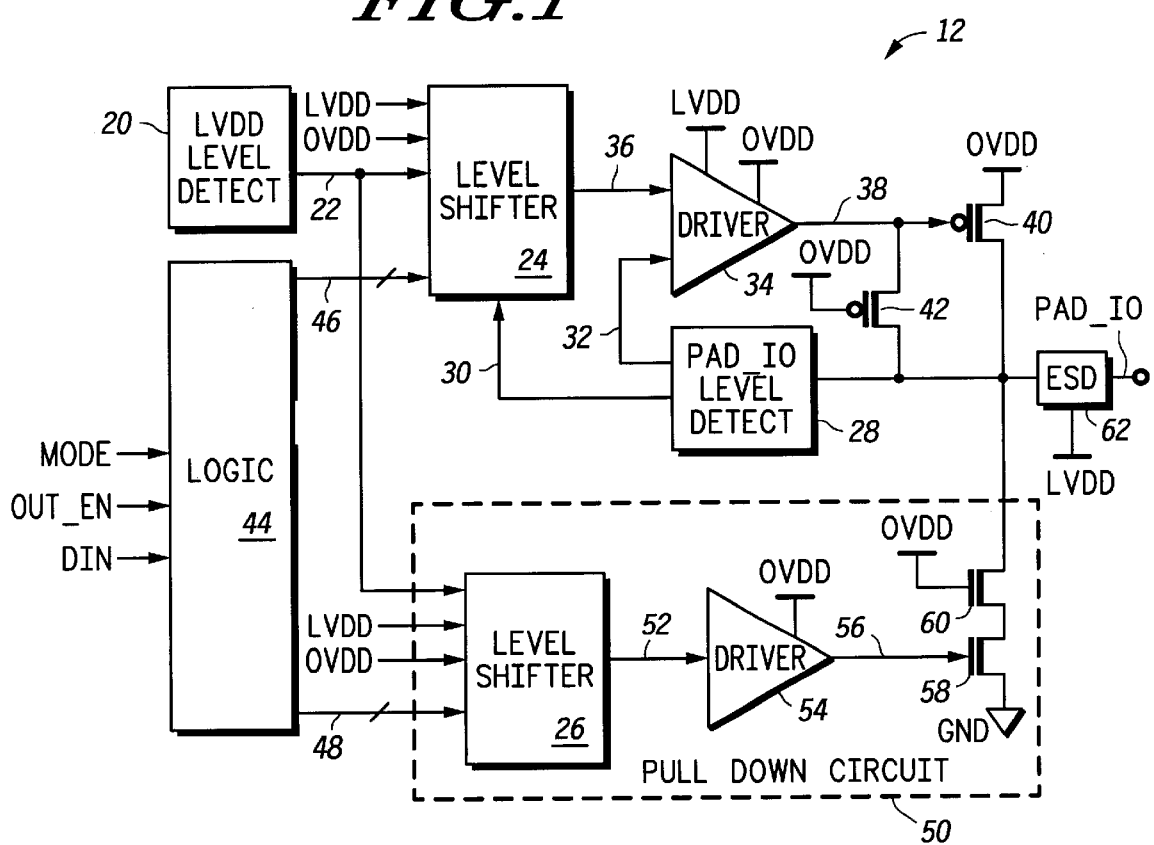
FIG. 2 is a block diagram of an embodiment of one of the output buffers shown in FIG. 1.

FIG. 2 is a block diagram of an embodiment of the output buffer 12 shown in FIG. 1. Note that the output buffer 14 is the same as the output buffer 12, so a schematic diagram of the output buffer 14 is not shown. The output buffer 12 includes LVDD level detect circuitry 20 for detecting the voltage level of LVDD and generating a level detect signal 22 which is sent to the level shifters 24 and 26. FIG. 2 also shows PAD_IO level detect circuitry 28 which uses the voltage at PAD_IO to generate a pad detect signal 30 which is sent to the level shifter 24. In other words, the level detect circuitry 28 detects when a voltage on the PAD_IO exceeds OVDD and generates a signal in response to the detection. The level detect circuitry 28 generates a pad detect signal 32 which is sent to a driver 34. The driver 34 also receives a level shifter output signal 36 from the level shifter 24. The output 38 of the driver 34 is received by the gate of an output switching device 40 which may be comprised of a p-channel MOSFET. The switching device 40 is coupled between OVDD and PAD_IO, and is gated by the output 38. That is, a first current electrode of switching device 40 is coupled to OVDD, a second current electrode is coupled to PAD_IO, and a control electrode is coupled to output 38. Another switching device 42 is coupled between the output 38 of the driver 34 and PAD_IO. The gate of the switching device 42 is coupled to OVDD.

FIG. 2 also shows logic circuitry 44 having inputs MODE, OUT_EN, and DIN, corresponding to the inputs shown in FIG. 1. The logic circuitry 44 includes outputs for sending data signals 46 and 48 to the level shifters 24 and 26, respectively. FIG. 2 shows a pull down circuit 50 having an output connection to the PAD_IO, and input connections to the level detect signal 22 and to the data signal 48. The level shifter 26 generates a level shifter output signal 52 which is received by a driver 54. The signal 56 generated at the output of the driver 34 and is received by the gate of a switching device 58 coupled between ground and a switching device 60. The switching device 60 is coupled between PAD_IO and the switching device 58 and is gated by OVDD. FIG. 2 also shows electrostatic discharge (ESD) circuitry 62 coupled to PAD_IO and LVDD.

Figure 3:
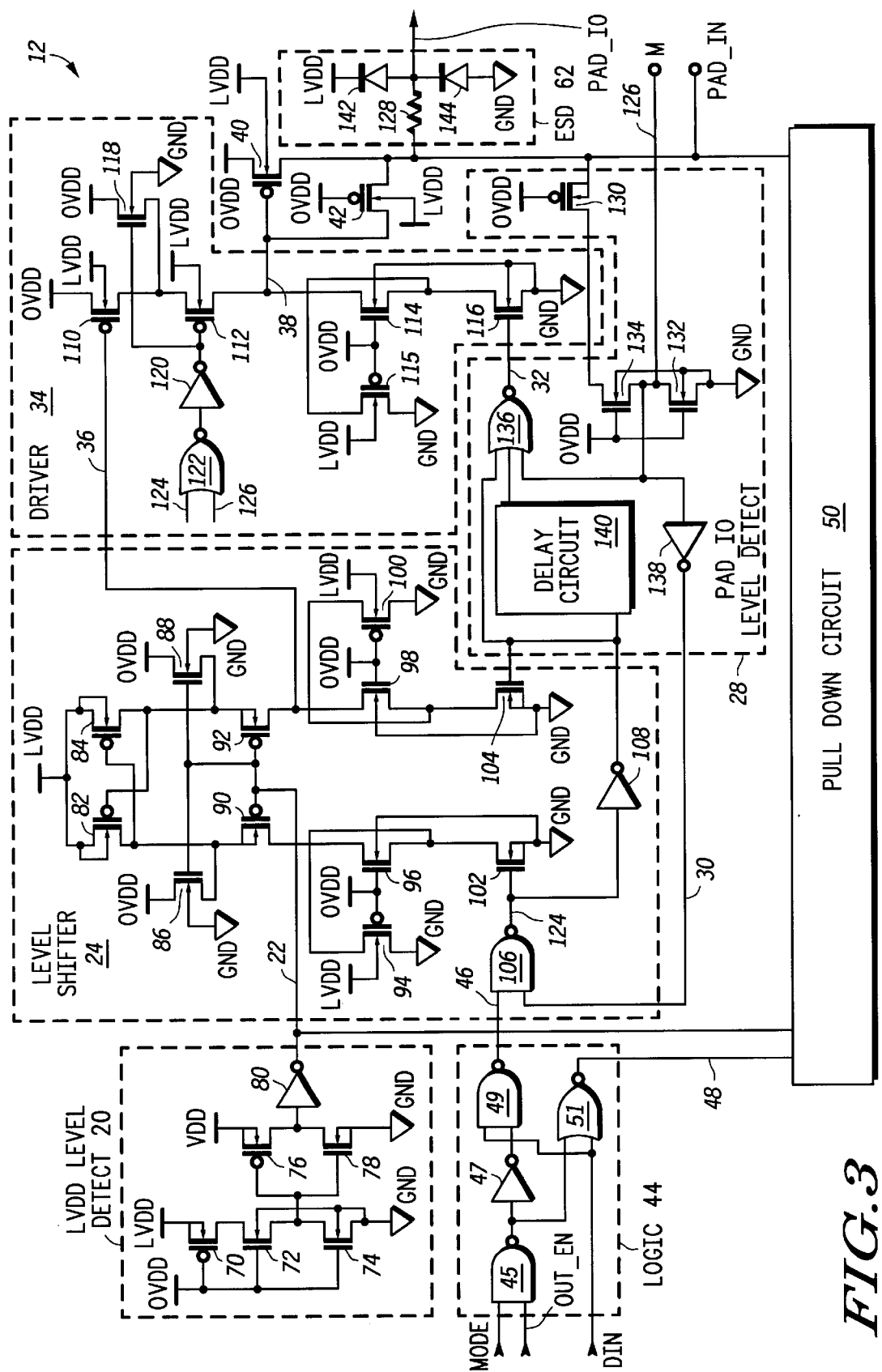
FIG. 3 is a schematic diagram of an embodiment of the output buffer shown in FIG. 2.

FIG. 3 is a schematic diagram of an embodiment of the output buffer 12 shown in FIG. 2. The details of FIG. 3 will be described in conjunction with the operation of the output buffer 12 during common voltage range operation and during operation when a 5 volt tolerant signal is received (extended voltage range operation).

The LVDD level detect circuitry 20 functions as a configuration circuit which self detects the supply level of the external voltage supply LVDD (i.e., functions as a voltage sensing circuit) and configures the buffer circuit based on the supply level. The level detect circuitry 20 is comprised of three switching devices 70, 72, and 74 coupled in series between LVDD and ground. All three switching devices 70, 72, and 74 are gated by OVDD. The level detect circuitry 20 also includes two switching devices 76 and 78 coupled in series between VDD and ground and gated by a current electrode (e.g. the source) of switching device 72. The switching device 70 functions as a voltage sensing circuit to sense the voltages of LVDD and OVDD. Other switching devices in the output buffer 12 also function as a voltage sensing circuit (e.g., switching devices 42 and 130). In the embodiment shown, the switching devices 70 and 76 are p-channel devices, while the switching devices 72, 74, and 76 are n-channel devices. The level detect circuitry 20 may also include an inverter 80 having an input coupled to the connection point between the switching devices 76 and 78. The output of the inverter 80 is the level detect signal 22 shown in FIG. 2. The function of the LVDD level detect circuitry 20 is to determine the voltage of LVDD and provide a signal to the level shifters 24 and 26 indicating when LVDD is 5 volts. When LVDD is 5 volts, the signal 22 will be high (1.8 volts). When LVDD is 3.3 volts, the signal 22 will be low (0 volts).

As mentioned above, the level shifter 24 receives the signal 22 from the level detect circuitry 20 forming a control node at the gates of switching devices 90 and 92 for controlling the speed of the level shifter 24. The purpose of the signal 22 is to ensure that the level shifter 24 operates properly whether the voltage of LVDD is 3.3 volts or 5 volts. The level shifter 24 includes switching devices 82, 84, 86, 88, 90, 92, 94, 96, 98, 100, 102, and 104, NAND gate 106, and inverter 108 coupled as shown in FIG. 3. In the embodiment shown, the switching devices 82, 84, 90, 92, 94, and 100 are p-channel switching devices while switching devices 86, 88, 96, 98, 102, and 104 are n-channel switching devices. The switching devices 86, 88, 94, and 100 provide protection circuitry, while the remaining switching devices provide the required switching functions. The protection circuitry formed by switching devices 86, 88, 94, and 100 is selectively enabled via the signal 22 at the control node of the level shifter 24. The data signal 46 and pad detect signal 30 are provided as inputs to the NAND gate 106 which gates the switching device 102 by generating signal 124. The connection point between the switching devices 92 and 98 forms the output of the level shifter 24 for providing the level shifter output signal 36 to the driver 34. The function of the level shifter is to generate an output signal 36 based on the input signals 46 and 30, while the signal 22 is used ensure that the level shifter 24 operates properly regardless of the voltage of LVDD. The level shifter additionally serves the purpose of translating the inputs to the level shifter 24 (e.g. inputs 46 and 30) from a VDD level signal to an LVDD level signal (e.g. output 36) capable of switching off switching device 110 under all operating conditions of VDD, OVDD, and LVDD.

As mentioned above, the driver 34 receives the level shifter output signal 36 as well as pad detect signal 32 and generates an output 38 based on these inputs. Note that during common voltage range operation (in one embodiment, this refers to PAD_IO being at 3.3 volts), the pad detect signal 32 will be inverted by the output of inverter 108 and the driver 34 will function normally. During common voltage range operation, the voltage of the output 38 of the driver 34 will be at 0 or OVDD. The driver includes switching devices 110, 112, 114, and 116 coupled in series between OVDD and ground. The output signal 36 of the level shifter 24 drives the gate of the switching device 110.

The output 38 of the driver 34 is formed by the connection between the switching devices 112 and 114. The gate of the switching device 112 is coupled to an inverter 120 which is coupled to a NOR gate 122. The inputs of the NOR gate 122 are coupled to signal 124 from the level shifter and to signal 126 from the PAD_IO level detect circuitry 28. The gate of the switching device 112 is also coupled to the gate of switching device 118 which is coupled between OVDD and the source of switching device 112. Switching devices 115 and 11 8 provide protection for driver 34 from leakage current while it is not enabled. The gates of switching devices 114 and 115 are coupled to OVDD. The switching device 115 is coupled between ground and the source of switching device 114. The gate of switching device 116 is coupled to the pad detect signal 32.

The logic circuitry 44 which provides the signal 46 to the level shifter 24 and signal 48 to the pull down circuit 50 is comprised of NAND gates 45 and 49, inverter 47, and NOR gate 51. The NAND gate 45 receives the MODE and OUT_EN signals shown in FIG. 2. The output of the NAND gate 45 is coupled to the inputs of inverter 47 and NOR gate 51. The output of the inverter 47 is coupled to one input of the NAND gate 49. The DIN input is coupled to inputs of the NAND gate 49 and NOR gate 51. The output of the NAND gate 49 provides the signal 46 to the level shifter 24. The output of the NOR gate 51 provides the signal 48 to the pull down circuit 50.

The ESD circuitry 62 mentioned above includes diodes 142 and 144 and resistor 128. The diode 142 is coupled between PAD_IO and LVDD. The diode 144 is coupled between PAD_IO and GND. The resistor 128 is coupled between PAD_IO and PAD_IN. The ESD circuitry 62 serves two functions. First, ESD protection is provided. Second, the diodes 142 and 144 clamp input voltages to a range approximately one volt outside LVDD and GND.

During common voltage range operation, the function of the driver 34 is to use the level shifter output signal 36 to drive the switching device 40, via output 38, in order to pull the PAD_IO to OVDD for a logic high. For a logic low, the driver 34 turns the switching device 40 off, and the pull down circuit 50 (described below) pulls the PAD_IO to ground.

During operation, when a 5 volt tolerant signal is received by the PAD_IO, the output buffer circuitry must be protected from break down voltages applied on the transistors. Specifically, the switching devices 40 and 110 should be tuned off, creating a high impedance state to prevent current from flowing from the PAD_IO, through the switching devices 40 and 110 to OVDD. The PAD_IO level detect circuitry 28 detects the voltage at PAD_IO and modifies the operation of the level shifter 24 and driver 34 as follows. The switching device 42 is coupled between PAD_IO (via resistor 128) and the output 38 of the driver 34. When the voltage of PAD_IO is 5 volts, the switching device 42 turns on, pulling the voltage at output 38 to 5 volts. The switching device 40 is then turned off. The PAD_IO level detect circuitry 28 includes switching devices 130, 132, and 134. When the voltage of PAD_IO is 5 volts, the switching device 130 also turns on. Devices 130, 134, and 132 form a voltage divider, which sets signal 126 to 1.8 volts. The signal 126 is coupled to NOR gate 136 which is coupled to the gate of switching device 116. The output of the NOR gate 136 turns the switching device 116 off. The signal 126 is also coupled to an inverter 138 which provides the pad detect signal 30 to the NAND gate 106 described above. When the pad detect signal 30 goes to 0 volts, signal 30 overrides signal 46 causing the switching devices 102 and 96 turn on.

As a result of devices 102 and 96 turning on, the switching devices 84 and 92 also turn on to pull the level shifter output signal 36 to LVDD (5 volts), turning switching device 10 off. The PAD_IO level detect circuitry 28 also includes delay circuit 140 coupled between the inverter 108 and NOR gate 136. The purpose of the delay circuit 140 is to ensure that the switching device 110 turns off before the switching device 116 turns on.

Figure 4:
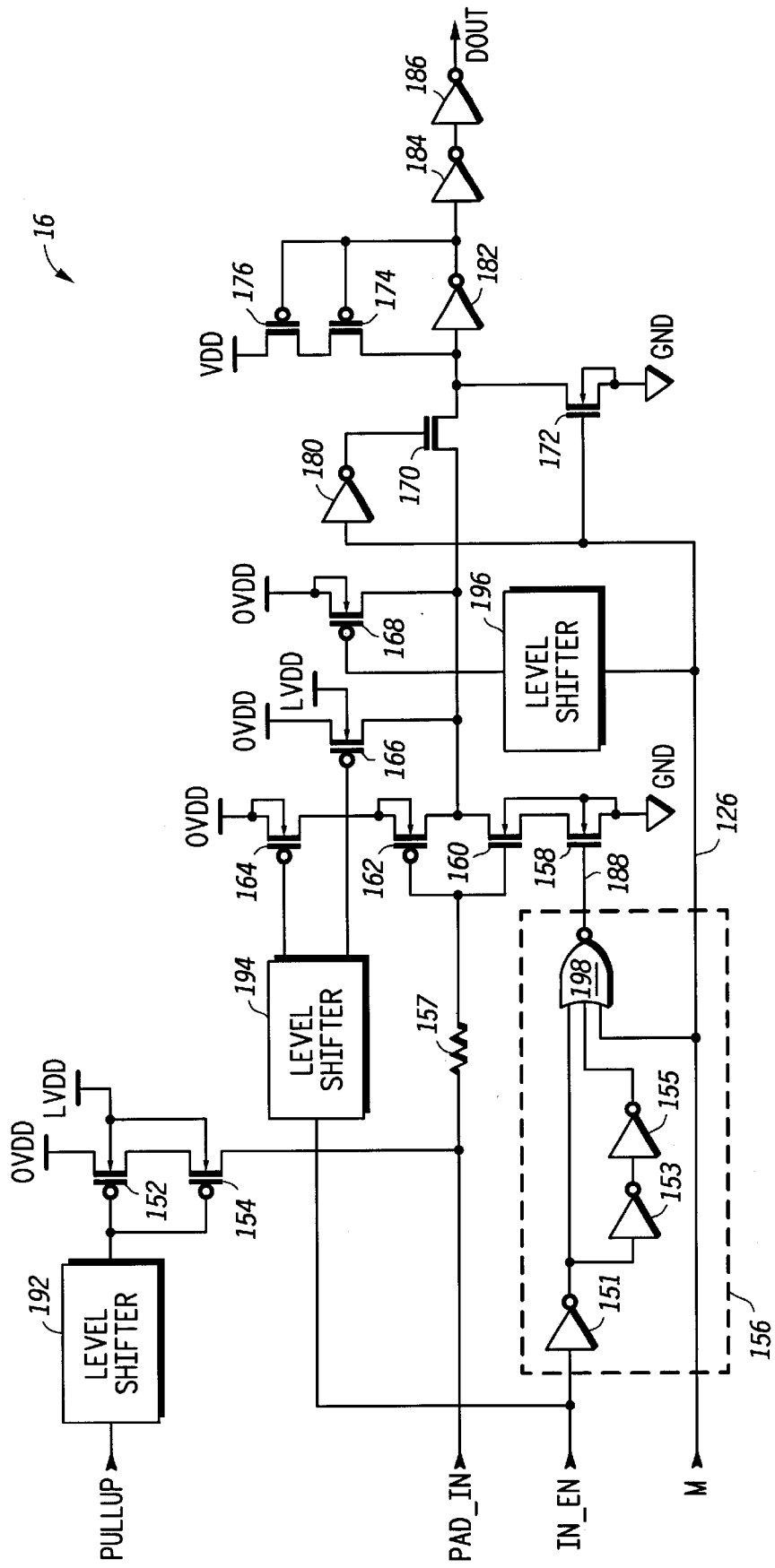
FIG. 4 is a schematic diagram of an embodiment of the input buffer shown in FIG. 1.

FIG. 4 is a schematic diagram of an embodiment of the input buffer 16 shown in FIG. 1. The details of FIG. 3 will be described in conjunction with the operation of the input buffer 16 during common voltage range operation and during extended voltage range operation when a 5 volt tolerant signal is received.

The input buffer 16 includes connections PULLUP, DOUT, and IN_EN with the core of the integrated circuit. The input buffer 16 also includes connections M and PAD_IN to the output buffers 12 and 14. The connection PAD_IN provides a connection to the PAD_IO via the resistor 128 (FIG. 3). The connection M provides a connection to signal 126 shown in FIG. 3.

The PULLUP signal is provided to circuitry which includes level shifter 192 and switching devices 152 and 154. The pullup circuitry optionally pulls the pad up to OVDD when the output buffers 12, 14, and the PAD_IO bus are tristated. The level shifter 192 is coupled between the pullup signal and the gates of switching devices 152 and 154. The switching devices 152 and 154 are coupled in series between OVVD and PAD_IN.

During common voltage range operation, the input buffer 16 operates as follows. As mentioned above, the signal 126 is 1.8 volts when a 5 volt tolerant signal arrives at the PAD_IO. Otherwise, during common voltage range operation, the signal 126 is 0 volts. As a result of the signal 126 being 0 volts, the switching device 168 is turned off via the inverting level shifter 196. In addition, the switching device 170 is turned on via inverter 180. Switching device 172 is turned off. During the operation of the input buffer 16, the buffer will receive an enabling signal via the IN_EN connection. The IN_EN connection is coupled to a buffer enabling circuit 156 which includes inverters 151, 153, 155, and NOR gate 198. The NOR gate 198 includes inputs coupled to the inverters and to the signal 126. During common voltage range operation, the Output 188 of the buffer enabling circuit 156 is high which turns on switching device 158. At the same time, the IN_EN signal turns on switching device 164 and turns off switching device 166 via inverting level shifter 194. Since switching devices 164 and 158 are turned on, OVDD is provided to the source of switching device 162 and a GND connection is provided to the source of switching device 160.

When a digital signal (e.g. a logic level high or a logic level low) is received at the PAD_IN connection, the signal passes through resistor 157 and is presented to the gates of switching devices 160 and 162. If the signal is high, switching device 160 turns on, pulling the drains of the switching devices 160 and 162 to ground. The inverters 182, 184, and 186 invert the low signal three times resulting in a high signal (1.8 volts) at the output DOUT. Since the output of inverter 182 is high, the switching devices 174 and 176 are turned off.

If the signal at PAD_IN is low, switching device 162 turns on, pulling the drains of the switching devices 160 and 162 to OVDD. The inverters 182, 184, and 186 invert the high signal three times resulting in a low signal at the output DOUT. Since the output of inverter 182 is low, the switching devices 174 and 176 turn on, coupling the input of inverter 182 to VDD. Switching devices 174 and 176 maintain the signal input of device 182 at VDD (1.8 volts) until this signal input is discharged to low (0 volts) and to provide a hysterisis. It can be seen that during common voltage range operation, when signal 126 is low, the output DOUT will match the logic state of the signal received at the PAD_IN connection.

As mentioned above, when a 5 volt tolerant signal arrives at the PAD_IO, the signal 126 will be 1.8 volts. As a result, the output 188 of the NOR gate 198 will be low, turning off switching device 158. The signal 126 will cause the switching device 168 to turn on via inverting level shifter 196. This pulls the drain of switching device 168 to OVDD (3.3 volts). Signal 126 also turns on switching device 172 pulling the input of inverter 182 to ground. Signal 126 is inverted by inverter 180 and turns off switching device 170, effectively disabling PAD_IN and allowing switching device 172 to drive the input of inverter 182 and therefore drive the output DOUT of the input buffer 16. The signal at the input of inverter 182 is inverted by inverters 182, 184, and 186 resulting in a 1.8 volt signal at the output DOUT. The output of inverter 182 also turns off switching devices 176 and 174 which isolates VDD from the input of inverter 182. In effect, the signal 126 and the components described above, create a path circuit for driving the output DOUT when a 5 volt tolerant signal arrives at the PAD_IO. Signals 188, 126, and the outputs of level shifters 194 and 196 limit the voltage across transistors 160 and 162 to prevent break down.

Figure 5:
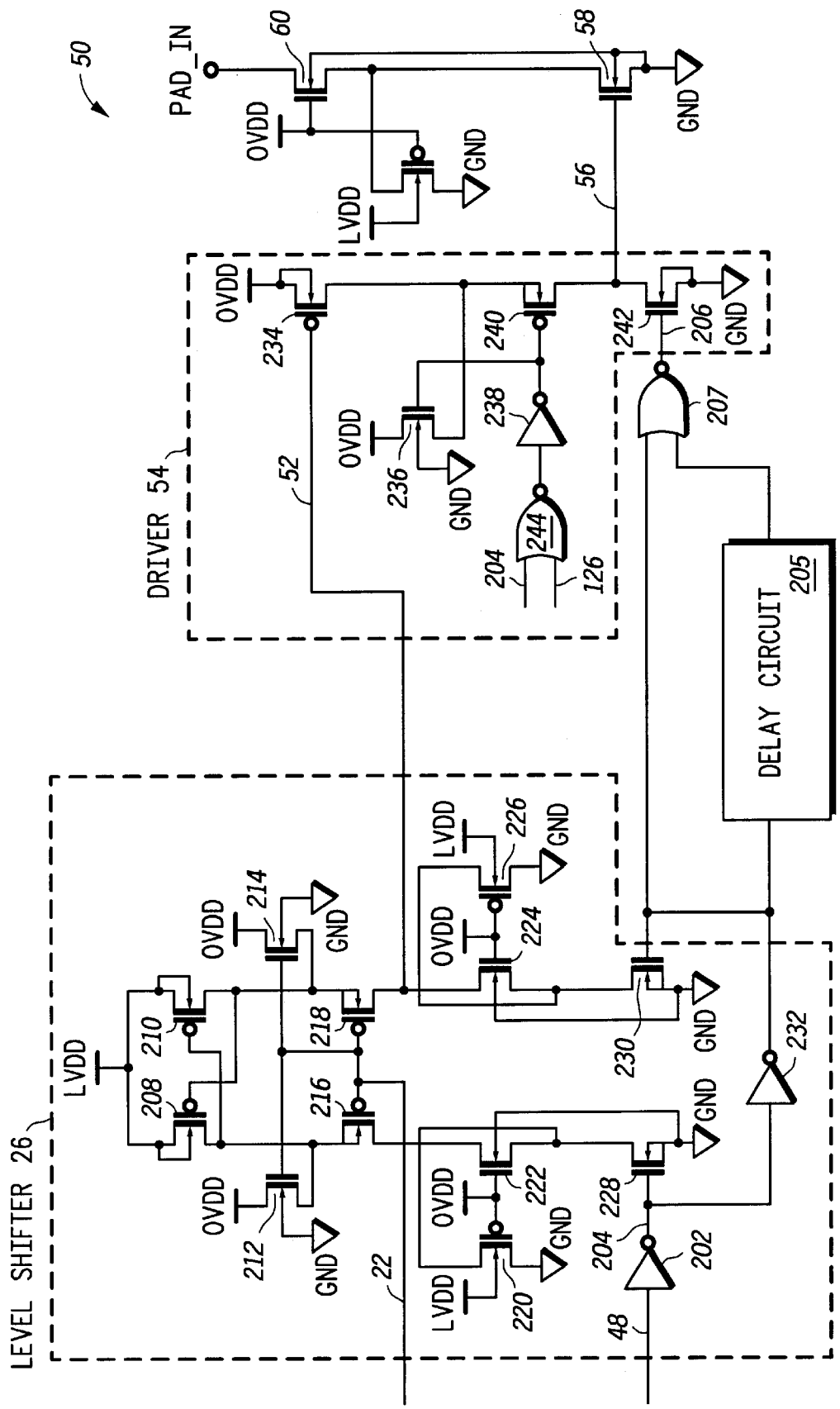
FIG. 5 is a schematic diagram of an embodiment of the pull down circuit shown in FIG. 3.

FIG. 5 is a schematic diagram of an embodiment of the pull down circuit 50 shown in FIG. 3. The pull down circuit 50 operates in a manner similar to the circuit shown in FIG. 3. The pull down circuit 50 includes a level shifter 26 which is substantially similar to the level shifter 24 shown in FIG. 3. The level shifter 26 receives the signal 22 from the LVDD level detect circuitry 20 so that it can be a self-configuring circuit that permits the pull down circuit 50 to operate properly whether the voltage of LVDD is 3.3 volts or 5 volts. As is also shown in FIGS. 2 and 3, the level shifter 26 has an input coupled to signal 48 from the logic circuitry 44. The signal 48 is inverted by inverter 202 creating signal 204 which is similar to signal 124 shown in FIG. 3. As mentioned, the level shifter 26 includes another input coupled to signal 22 from the level detect circuitry 20. The level shifter 26 provides a level shifter output signal 52 to the driver 54. The level shifter 26 also includes switching devices 208, 210, 212, 214, 216, 218, 220, 222, 224, 226, 228, 230, and inverter 232. In one embodiment, these devices are analogous to switching devices 82, 84, 86, 88, 90, 92, 94, 96, 98, 100, 102, 104, and inverter 108 of FIG. 3, respectively. (Therefore, note that certain components shown in FIG. 5 are analogous to components in the output buffer 12 shown in FIG. 3.)

The pull down circuit 50 also includes delay circuit 205 coupled between the level shifter 26 and a NOR gate 207. The NOR gate 207 generates the signal 206 which is provided to the driver 54. The driver 54 includes switching devices 234, 236, 240, 242, NOR gate 244, and inverter 238. (In one embodiment, these devices are analogous to switching devices 110, 118, 112, 116, NOR gate 122, and inverter 120 of FIG. 3, respectively.) The driver 54 receives the level shifter output signal 52 and the signal 206 and generates the output signal 56 based on these inputs. The output signal 56 drives the switching device 58. When a logic low signal is received from the core by the DIN connection, the driver 54 turns on the switching devices 58 and 60, pulling the PAD_IO to ground. When a logic high signal is received by the DIN connection, the driver 54 turns off the switching device 58, isolating the PAD_IO from ground. Note that the level shifters 24 and 26 and the drivers 34 and 54 are designed to track each other for the purpose of preventing current from shooting through the switching devices 40, 60, and 58. Switching devices 58 and 60 should be turned off before switching device 40 turns on and vice versa.

The switching devices described and shown in the figures may be comprised of any suitable switching device. In one embodiment, p-channel switching devices shown in the figures include PMOSFETS (also referred to as PMOS transistors), and the n-channel switching devices include NMOSFETS (also referred to as NMOS transistors). Of course, other suitable types of switching devices could also be used. In this description, a "current electrode" can refer to the drain or source of the switching devices, and the "control electrode" can refer to the gate of the switching devices.

Note that various switching devices shown in the figures show well connections to LVDD. This connection to LVDD ensures that the switching devices are not improperly biased.

Although embodiments of the invention have been described with respect to specific polarity of potentials, skilled artisans appreciated that conductivity types and polarities of potentials may be reversed.

The specific voltage levels described above have been included as examples. It should be understood that the invention may be used in applications with voltage levels other than those described.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A buffer circuit, comprising:
    an input/output pin;
    an input/output circuit coupled to the input/output pin; and
    a configuration circuit coupled to the input/output circuit, wherein the configuration circuit self detects a supply level of an external voltage supply and configures the input/output circuit based on the supply level.

2. The buffer circuit of claim 1, wherein the buffer circuit is adapted for use with a PCI bus application.

3. The buffer circuit of claim 1, wherein the external voltage supply is greater than a predetermined drive voltage level.

4. The buffer circuit of claim 3, wherein the external voltage supply is approximately equal to the predetermined drive voltage level.

5. The buffer circuit of claim 1, wherein the input/output circuit includes a driver circuit.

6. The buffer circuit of claim 1, wherein the configuration circuit comprises a voltage sensing circuit, the voltage sensing circuit comprising:
   a first input to receive the external voltage supply;
   a second input to receive a second external voltage supply;
   an output; and
   a first transistor having a first current electrode coupled to the first input, a control electrode coupled to the second input, and a second current electrode coupled to the output.

7. The voltage sensing circuit of claim 6, wherein the second current electrode of the first transistor provides a current when the supply level of the external voltage supply differs from a supply level of the second external voltage supply.

8. The buffer circuit of claim 1, wherein the input/output circuit comprises:
   a driver circuit;
   an output level detection circuit coupled to the driver circuit; and
   an output transistor having a first current electrode coupled to a first power supply, a second current electrode coupled to the output pad and the output level detection circuit, and a control electrode coupled to the driver circuit.

9. A buffer circuit, comprising:
   an input/output pin;
   an input/output circuit coupled to the input/output pin, wherein the input/output circuit comprises:
      a driver circuit;
      an output level detection circuit coupled to the driver circuit; and
      an output transistor having a first current electrode coupled to a first power supply, a second current electrode coupled to the output pad and the output level detection circuit, and a control electrode coupled to the driver circuit.

10. The output buffer circuit of claim 9, wherein the output level detection circuit detects when a voltage on the output pad exceeds the first power supply.

11. The output buffer circuit of claim 10, wherein when the output pad exceeds the first supply voltage, the output level detection circuit provides a control signal to the driver circuit.

12. The output buffer circuit of claim 11, wherein the driver enters a high impedance state based at least in part on the control signal.

13. The output buffer circuit of claim 9, further comprising:
   a first transistor having a first current electrode coupled to the control electrode of the output transistor, a second current electrode coupled to the output pad, and a control electrode coupled to the first power supply.

14. The output buffer circuit of claim 13, wherein when the output pad receives a voltage greater than a predetermined value, the first transistor couples the control electrode of the output transistor to the second current electrode of the output transistor.

15. The output buffer circuit of claim 13, further comprising:
   a voltage sensing circuit coupled to the first power supply and to a second power supply; and
   a level shifting circuit coupled to the voltage sensing circuit, the driver circuit, and the output level detection circuit.

16. The output buffer circuit of claim 15, wherein the voltage sensing circuit comprises:
   a second transistor having a first current electrode coupled to the second power supply, a control electrode coupled to the first power supply, and a second control electrode coupled to the level shifting circuit.

17. The output buffer circuit of claim 16, wherein the level shifting circuit comprises a control node coupled to the second control electrode of the second transistor, the control node controlling a speed of the level shifting circuit.

18. The output buffer circuit of claim 17, further comprising:
   a pull-down circuit coupled to the voltage sensing circuit and the output pad.

19. The output buffer circuit of claim 18, further comprising a protection circuit coupled to the output pad.

20. The output buffer circuit of claim 16, wherein the first power supply differs from the second power supply.

21. The output buffer circuit of claim 9, wherein the output buffer circuit is adapted for use with a PCI bus application.

* * * * *